(12) United States Patent
Beers et al.

(10) Patent No.: US 10,563,121 B2
(45) Date of Patent: Feb. 18, 2020

(54) RED-EMITTING PHOSPHORS AND ASSOCIATED DEVICES

(71) Applicant: GENERAL ELECTRIC COMPANY, Schenectady, NY (US)

(72) Inventors: William Winder Beers, Chesterland, OH (US); Jianmin He, Orange, OH (US); Fangming Du, Northfield, OH (US); James Edward Murphy, Niskayuna, NY (US); William Erwin Cohen, Solon, OH (US); Clark David Nelson, Concord Township, OH (US); Cynthia Susan Link, East Cleveland, OH (US)

(73) Assignee: CURRENT LIGHTING SOLUTIONS, LLC, East Cleveland, OH (US)

( * ) Notice: Subject to any disclaimer, the term of this patent is extended or adjusted under 35 U.S.C. 154(b) by 2 days.

(21) Appl. No.: 15/171,098

(22) Filed: Jun. 2, 2016

(65) Prior Publication Data

US 2016/0289553 A1     Oct. 6, 2016

Related U.S. Application Data

(63) Continuation-in-part of application No. 14/303,020, filed on Jun. 12, 2014, now Pat. No. 9,567,516.

(51) Int. Cl.
*C09K 11/61* (2006.01)
*H01L 33/50* (2010.01)

(52) U.S. Cl.
CPC .......... *C09K 11/617* (2013.01); *H01L 33/502* (2013.01)

(58) Field of Classification Search
CPC ... C09K 11/616; C09K 11/617; C09K 11/675; C09K 11/628; C09K 11/645; C09K 11/665; C09K 11/0838; C09K 11/02025; C09K 11/664; H01L 33/502; H01L 33/504; H01L 33/507; C01P 2004/61
USPC ..... 252/301.4 F, 301.4 H, 301.4 R; 313/486, 313/503
See application file for complete search history.

(56) References Cited

U.S. PATENT DOCUMENTS

| 7,358,542 | B2 | 4/2008 | Radkov et al. | |
| 7,497,973 | B2 * | 3/2009 | Radkov | C09K 11/617 252/301.4 F |
| 7,648,649 | B2 | 1/2010 | Radkov et al. | |
| 8,057,706 | B1 * | 11/2011 | Setlur | C09K 11/02 252/301.4 F |

(Continued)

FOREIGN PATENT DOCUMENTS

WO   WO 2009077350 A1 *  6/2009  ........... C09K 11/664

*Primary Examiner* — Matthew E. Hoban
*Assistant Examiner* — Lynne Edmondson
(74) *Attorney, Agent, or Firm* — Buckley, Maschoff & Talwalkar LLC (57) ABSTRACT

A method includes obtaining particles of a phosphor precursor of formula $A_x[MF_y]:Mn^{4+}$, reducing sizes of the particles of the phosphor precursor by wet milling the particles and annealing the particles that are wet milled by contacting the particles with a fluorine-containing oxidizing agent. Additionally, a manganese doped complex fluoride phosphor prepared by this method is provided. A lighting apparatus and backlight device that include manganese-doped phosphor prepared by this method also are provided.

17 Claims, 8 Drawing Sheets (56) References Cited

U.S. PATENT DOCUMENTS

| | | | | |
|---|---|---|---|---|
| 8,252,613 | B1* | 8/2012 | Lyons | C09K 11/617 438/45 |
| 8,710,487 | B2* | 4/2014 | Lyons | C09K 11/617 257/13 |
| 8,906,724 | B2* | 12/2014 | Murphy | H01L 33/52 438/34 |
| 9,512,356 | B2* | 12/2016 | Lyons | C09K 11/617 |
| 9,512,357 | B2* | 12/2016 | Murphy | C09K 11/617 |
| 9,546,318 | B2* | 1/2017 | Murphy | C09K 11/617 |
| 9,567,516 | B2* | 2/2017 | Murphy | F21K 9/60 |
| 9,698,314 | B2* | 7/2017 | Murphy | H01L 33/502 |
| 9,868,898 | B2* | 1/2018 | Murphy | C09K 11/616 |
| 2010/0090585 | A1* | 4/2010 | Seto | C04B 35/16 313/503 |
| 2012/0299466 | A1* | 11/2012 | Lyons | C09K 11/617 313/503 |
| 2014/0116079 | A1 | 5/2014 | Murphy et al. | |
| 2014/0264418 | A1* | 9/2014 | Murphy | H01L 33/52 257/98 |
| 2016/0115382 | A1 | 4/2016 | Du et al. | |
| 2016/0126428 | A1 | 5/2016 | Hosokawa et al. | |

\* cited by examiner

RED-EMITTING PHOSPHORS AND ASSOCIATED DEVICES

CROSS-REFERENCE TO RELATED APPLICATIONS

This application is a continuation-in-part of U.S. patent application Ser. No. 14/303,020, which was filed on 12 Jun. 2014, and the entire disclosure of which is incorporated herein by reference.

BACKGROUND

Red-emitting phosphors based on complex fluoride materials activated by $Mn^{4+}$, such as those described in U.S. Pat. Nos. 7,358,542, 7,497,973, and 7,648,649, can be utilized in combination with yellow/green emitting phosphors such as YAG:Ce or other garnet compositions to achieve warm white light (CCTs<5000 K on the blackbody locus, color rendering index (CRI)>80 from a blue light emitting diode (LED), equivalent to that produced by current fluorescent, incandescent and halogen lamps. These materials absorb blue light strongly and efficiently emit between about 610-635 nm with little deep red/NIR emission. Therefore, luminous efficacy is maximized compared to red phosphors that have significant emission in the deeper red where eye sensitivity is poor. Quantum efficiency can exceed 85% under blue (440-460 nm) excitation.

While the efficacy and CRI of lighting systems using $Mn^{4+}$ doped fluoride hosts can be quite high, one potential limitation is their susceptibility to degradation under high temperature and humidity (HTHH) conditions (e.g., exposing to 80 degrees Celsius and 85% relative humidity). It is possible to reduce this degradation using post-synthesis processing steps, as described in U.S. Pat. No. 8,252,613. However, further improvement in stability of the materials is desirable

BRIEF DESCRIPTION

In one embodiment, a process for synthesizing a manganese ($Mn^{4+}$) doped phosphor is provided. A phosphor precursor of formula I (below) is milled to a desired or designated particle size and then contacted with a fluorine-containing oxidizing agent at an elevated temperature to form the Mn4+ doped phosphor $$A_x[MF_y]:Mn^{4+} \quad (I)$$

where A represents Li, Na, K, Rb, Cs, or a combination thereof, M represents Si, Ge, Sn, Ti, Zr, Al, Ga, In, Sc, Hf, Y, La, Nb, Ta, Bi, Gd, or a combination thereof, x has a value of the absolute value of the charge of the $[MF_y]$ ion, and y has a value of 5, 6 or 7.

In one embodiment, $Mn^{4+}$ doped phosphors that may be produced by the process are provided, and lighting apparatuses and backlight devices that include the $Mn^{4+}$ doped phosphors are provided.

In another embodiment, a method for synthesizing a manganese ($Mn^{4+}$) doped phosphor includes milling particles of a phosphor precursor of formula $A_x[MF_y]:Mn^{4+}$, where A includes one or more of lithium (Li), sodium (Na), potassium (K), rubidium (Rb), or cesium (Cs), M includes one or more of silicon (Si), germanium (Ge), tin (Sn), titanium (Ti), zirconium (Zr), aluminum (Al), gallium (Ga), indium (In), scandium (Sc), hafnium (Hf), yttrium (Y), lanthanum (La), niobium (Nb), tantalum (Ta), bismuth (Bi), or gadolinium (Gd), x has a value of an absolute value of a charge on an ion of $[MF_y]$, and y has a value of at least five and no greater than seven. The method also can include annealing the particles that are milled by contacting the particles with a fluorine-containing oxidizing agent and treating surfaces of the particles that are annealed by contacting the particles with a saturated solution of a compound of formula $B_x[M'F_y]$ in aqueous hydrofluoric acid, where B includes one or more of Na, K, Rb, or Cs and M' includes one or more of Si, Ge, or Ti. The method also can include annealing the particles subsequent to treating the surfaces of the particles by contacting the particles with the fluorine-containing oxidizing agent. In one embodiment, a manganese doped complex fluoride phosphor prepared by this process, a lighting apparatus and/or a backlight device including such a phosphor are provided.

In one embodiment, a method includes obtaining particles of a phosphor precursor of formula $A_x[MF_y]:Mn^{4+}$, where A includes one or more of lithium (Li), sodium (Na), potassium (K), rubidium (Rb), or cesium (Cs), wherein M includes one or more of silicon (Si), germanium (Ge), tin (Sn), titanium (Ti), zirconium (Zr), aluminum (Al), gallium (Ga), indium (In), scandium (Sc), hafnium (Hf), yttrium (Y), lanthanum (La), niobium (Nb), tantalum (Ta), bismuth (Bi), or gadolinium (Gd), x has a value of an absolute value of a charge on an ion of $[MF_y]$, and y has a value of at least five and no greater than seven. The method also includes reducing sizes of the particles of the phosphor precursor by wet milling the particles and annealing the particles that are wet milled by contacting the particles with a fluorine-containing oxidizing agent. Additionally, a manganese doped complex fluoride phosphor prepared by this method is provided. A lighting apparatus and backlight device that include manganese-doped phosphor prepared by this method also are provided.

In one embodiment, a method includes obtaining particles of a $K_2SiF_6:Mn^{4+}$ phosphor precursor, reducing sizes of the particles of the phosphor precursor by wet milling the particles, and annealing the particles that are wet milled by contacting the particles with a fluorine-containing oxidizing agent. Additionally, a manganese doped complex fluoride phosphor prepared by this method is provided. A lighting apparatus and backlight device that include manganese-doped phosphor prepared by this method also are provided.

BRIEF DESCRIPTION OF THE DRAWINGS

These and other features, aspects, and advantages of the inventive subject matter will become better understood when the following detailed description is read with reference to the accompanying drawings in which like characters represent like parts throughout the drawings, wherein.

DETAILED DESCRIPTION

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value. In the following specification and claims, the singular forms "a", "an" and "the" include plural referents, unless the context clearly dictates otherwise.

In one or more embodiments of the processes described herein, a phosphor precursor is milled into particles followed by treating the milled particles to enhance performance and stability (e.g., quantum efficiency, thermal stability, humidity stability, and/or light flux stability) of a resulting $Mn^{4+}$+ doped phosphor. The phosphor precursor is milled (or ground) to reduce particle size for desired properties. For example, as the particle size of the phosphor is reduced, the sedimentation rate (or settling rate) of the particles in an encapsulant material (for example, silicone) decreases. By controlling the particle size and particle size distribution, the sedimentation rate of the particles can be tuned to match, be slower or be faster than other phosphors in a blend, and thus enables control over the separation of phosphors. The separation of phosphors can be beneficial to protect the $Mn^{4+}$ doped phosphors from damage caused by the excitation flux. In addition, the amount and the location (closer or farther from an LED chip) of the phosphor particles can be controlled in order to achieve a desired color point. Moreover, small particle size (D50 particle size less than 30 microns) may allow the use of simple deposition techniques, for example spray coating techniques. It is also beneficial to have phosphors of smaller particle size and effectively avoid nozzle being jammed up during application of phosphors in the LED packaging process. The particle size may represent the largest outer dimension of a particle measured along a straight line (e.g., not a circumference or perimeter).

The phosphor precursor is a manganese ($Mn^{4+}$)-doped complex fluoride material of formula I. A complex fluoride material or phosphor includes a coordination compound, including at least one coordination center, surrounded by fluoride ions acting as ligands, and charge-compensated by counter ions as necessary. In one example, $K_2SiF_6$:$Mn^{4+}$, the coordination center is Si and the counter ion is K. Complex fluorides are occasionally written down as a combination of simple, binary fluorides but such a representation does not indicate the coordination number for the ligands around the coordination center. The square brackets (occasionally omitted for simplicity) indicate that the complex ion they encompass is a new chemical species, different from the simple fluoride ion. The activator ion ($Mn^{4+}$) also acts as a coordination center, substituting part of the centers of the host lattice, for example, Si. The host lattice (including the counter ions) may further modify the excitation and emission properties of the activator ion.

The phosphor precursor can be synthesized by adding a first solution that includes one or more sources of potassium and a second solution that includes one or more sources of silicon to a container with a third solution that includes one or more sources of manganese. The combined liquid formed by these solutions is stirred, and $K_2SiF_6$:$Mn^{4+}$ particles precipitate from the stirred mixture of the solutions as the phosphor precursor. Particle size distribution of the formed $K_2SiF_6$:$Mn^{4+}$ particles are typically affected by processing factors like concentration of feedstock solutions, flow rates, stirring rate, surface condition of reactor and so on. The precipitated particles of the phosphor precursor and remaining mixture of the solutions are discharged from the container and then filtered to separate the solid particles of the phosphor precursor from the liquid. These particles can then be rinsed in acetone and dried.

In particular embodiments, the coordination center of the precursor, that is, M in formula I, is Si, Ge, Sn, Ti, Zr, or a combination thereof. More particularly, the coordination center is Si, Ge, Ti, or a combination thereof, and the counter ion, or A in formula I, is Na, K, Rb, Cs, or a combination thereof, and y is 6. Examples of precursors of formula I include $K_2[SiF_6]$:$Mn^{4+}$, $K_2[TiF_6]$:$Mn^{4+}$, $K_2[SnF_6]$:$Mn^{4+}$, $Cs_2[TiF_6]$:$Mn^{4+}$, $Rb_2[TiF_6]$:$Mn^{4+}$, $Cs_2[SiF_6]$:$Mn^{4+}$, $Rb_2[SiF_6]$:$Mn^{4+}$, $Na_2[TiF_6]$:$Mn^{4+}$, $Na_2[ZrF_6]$:$Mn^{4+}$, $K_3[ZrF_7]$:$Mn^{4+}$, $K_3[BiF_6]$:$Mn^{4+}$, $K_3[YF_6]$:$Mn^{4+}$, $K_3[LaF_6]$:$Mn^{4+}$, $K_3[GdF_6]$:$Mn^{4+}$, $K_3[TaF_7]$:$Mn^{4+}$, and/or $K_3[TaF_7]$:$Mn^{4+}$. In particular embodiments, the precursor of formula I is $K_2SiF_6$:$Mn^{4+}$.

The phosphor precursor can be milled by milling techniques such as planetary milling, attrition milling, ball milling, air jet milling, pulveriser techniques, or a combination thereof. In a particular embodiment, the phosphor precursor is ball milled. Other milling (or grinding) techniques may be used, which provide reduced particle size (for example, a D50 particle size less than about 25 microns). In one embodiment, the milling is performed in a vacuum or in an inert environment. Thus, it is to be understood that any method of reducing the particle size of the phosphor precursor through these mechanical means, will not depart from the scope of the inventive subject matter. As described below, the phosphor precursor can be also milled using a wet ball milling process using a saturated $K_2SiF_6$ dissolved in HF solution in one embodiment to increase the reliability of phosphors created from the milled precursor (relative to using other milling or grinding techniques).

Milling or grinding particles of the phosphor precursor of formula I can be carried out for a selected period of time with a rotational speed that depends, in part, on the size of the particles before milling, along with the desired size of the resulting particles after milling. In one embodiment, the particles have a particle size distribution with a D50 value (or a D50 particle size) of less than about 30 microns after milling. In particular embodiments, the D50 particle size of the milled particles ranges from about 10 microns to about 20 microns, and more particularly from about 12 microns to about 18 microns.

In some embodiments, a liquid medium can be used for milling. The liquid medium may include ketones, such as acetone, alcohols, esters, such as t-butyl acetate, water, acids, or mixtures thereof. During milling, the phosphor compositions of formula I usually react with the liquid medium via hydrolysis and oxidation-reduction reactions, and exhibit a decrease in their performance. For example, Table 1 shows the drop in quantum efficiency of $K_2[SiF_6]$:$Mn^{4+}$ (PFS) with time when milled with acetone. In addition to the sensitivity of the phosphors of formula I to many liquid mediums, milling may also introduce defects into the phosphor precursor of formula I, and thereby lowering the performance of the resulting phosphor. In one embodiment, the liquid medium that is used for milling the phosphor precursor can be formed from saturated $K_2SiF_6$ dissolved in a HF solution at room temperature, as described below.

Alternately, when dry milling in dry air or other environments, the breaking of phosphor particles increases the susceptibility of these particles to hydrolysis and oxidation-reduction reactions with moisture in the air. This also can lower the performance of the phosphor. Thus, according to one or more embodiments of the inventive subject matter, after milling, the particles are treated to enhance performance and stability (quantum efficiency, thermal stability, humidity stability, flux stability, and color stability) of the resulting $Mn^{4+}$ doped phosphor. In one embodiment, the milled particles are contacted with a fluorine-containing oxidizing agent in gaseous form at an elevated temperature.

The temperature at which the particles are contacted with the fluorine-containing oxidizing agent is any temperature in the range from about 200° C. to about 700° C., particularly from about 350° C. to about 600° C. during contact, and in some embodiments from about 200° C. to about 700° C. In various embodiments of the present invention, the temperature is at least 100° C., particularly at least 225° C., and more particularly at least 350° C. The phosphor precursor particles are contacted with the oxidizing agent for a period of time sufficient to increase its performance and stability of the resulting phosphor. Time and temperature are interrelated, and may be adjusted together, for example, increasing time while reducing temperature, or increasing temperature while reducing time. In particular embodiments, the time is at least one hour, particularly for at least four hours, more particularly at least six hours, and most particularly at least eight hours.

After holding at the elevated temperature for the desired period of time, the temperature may be reduced at a controlled rate while maintaining the oxidizing atmosphere for an initial cooling period. After the initial cooling period, the cooling rate may be controlled at the same or a different rate, or may be uncontrolled. In some embodiments, the cooling rate is controlled at least until a temperature of 200° C. is reached. In other embodiments, the cooling rate is controlled at least until a temperature at which it is safe to purge the atmosphere is reached. For example, the temperature may be reduced to about 50° C. before a purge of the fluorine atmosphere begins.

Reducing the temperature at a controlled rate of ≤5° C. per minute may yield a phosphor product having superior properties compared to reducing the temperature at a rate of 10° C./minute. In various embodiments, the rate may be controlled at ≤5° C. per minute, particularly at ≤3° C. per minute, more particularly at a rate of ≤1° C. per minute.

The period of time over which the temperature is reduced at the controlled rate is related to the contact temperature and cooling rate. For example, when the contact temperature is 540° C. and the cooling rate is 10° C./minute, the time period for controlling the cooling rate may be less than one hour, after which the temperature may be allowed to fall to the purge or ambient temperature without external control. When the contact temperature is 540° C. and the cooling rate is ≤5° C. per minute, then the cooling time may be less than two hours. When the contact temperature is 540° C. and the cooling rate is ≤3° C. per minute, then the cooling time may be less than three hours. When the contact temperature is 540° C. and the cooling rate is ≤1° C. per minute, then the cooling time is may be less than four hours. For example, the temperature may be reduced to about 200° C. with controlled cooling, then control may be discontinued. After the controlled cooling period, the temperature may fall at a higher or lower rate than the initial controlled rate.

The fluorine-containing oxidizing agent may be $AlF_3$, $SbF_5$, $ClF_3$, $BrF_3$, $KrF$, $XeF_2$, $XeF_4$, $NF_3$, $SiF_4$, $PbF_2$, $ZnF_2$, $SnF_2$, $CdF_2$, or a combination thereof. In one or more embodiments, the fluorine-containing oxidizing agent is $F_2$. The amount of oxidizing agent in the atmosphere may be varied to obtain the stable phosphor particles, particularly in conjunction with variation of time and temperature. Where the fluorine-containing oxidizing agent is $F_2$, the atmosphere may include at least 0.5% $F_2$, although a lower concentration may be effective in some embodiments. In particular, the atmosphere may include at least 5% $F_2$ and more particularly at least 20% $F_2$. The atmosphere may additionally include nitrogen, helium, neon, argon, krypton, xenon, in any combination with the fluorine-containing oxidizing agent. In a particular embodiment, the atmosphere is composed of about 20% $F_2$ and about 80% nitrogen.

The manner of contacting the milled particles with the fluorine-containing oxidizing agent may be accomplished in any way sufficient to convert the precursor particles to a stable phosphor having the desired properties. In some embodiments, a chamber containing the precursor particles may be dosed and then sealed such that an overpressure develops as the chamber is heated, and in others, the fluorine and nitrogen mixture is flowed throughout the anneal process ensuring a more uniform pressure. In some embodiments, an additional dose of the fluorine-containing oxidizing agent may be introduced after a period of time.

In one embodiment, the milled particles are further treated with a saturated solution of a composition of formula II in aqueous hydrofluoric acid, as described in U.S. Pat. No. 8,252,613, after contacting the particles with the fluorine-containing oxidizing agent.

$$A_x[MF_y]  \qquad (II)$$

The temperature at which the phosphor is contacted with the solution ranges from about 20° C. to about 50° C. The period of time required to treat the phosphor ranges from about one minute to about five hours, particularly from about five minutes to about one hour. Concentration of hydrofluoric acid in the aqueous HF solutions ranges from about 20% w/w to about 70% w/w, particularly about 40% w/w to about 70% w/w. Less concentrated solutions may result in lower yields of the phosphor.

Any numerical values recited herein include all values from the lower value to the upper value in increments of one unit provided that there is a separation of at least 2 units between any lower value and any higher value. As an example, if it is stated that the amount of a component or a value of a process variable such as, for example, temperature, pressure, time and the like is, for example, from 1 to 90, preferably from 20 to 80, more preferably from 30 to 70, it is intended that values such as 15 to 85, 22 to 68, 43 to 51, 30 to 32 etc. are expressly enumerated in this specification. For values which are less than one, one unit is considered to be 0.0001, 0.001, 0.01 or 0.1 as appropriate. These are only examples of what is specifically intended and all possible combinations of numerical values between the lowest value and the highest value enumerated are to be considered to be expressly stated in this application in a similar manner.

In another aspect, the inventive subject matter provides a process that includes milling particles of a phosphor precursor, and then contacting the milled precursor particles at an elevated temperature with a fluorine-containing oxidizing agent to form the Mn$^{4+}$ doped phosphor. The precursor is selected from the group consisting of:
- (A) $A_2[MF_5]$:Mn$^{4+}$ (where A is selected from Li, Na, K, Rb, Cs, and combinations thereof, and M is selected from Al, Ga, In, and combinations thereof),
- (B) $A_3[MF_6]$:Mn$^{4+}$ (where A is selected from Li, Na, K, Rb, Cs, and combinations thereof, and M is selected from Al, Ga, In, and combinations thereof),
- (C) $Zn_2[MF_7]$:Mn$^{4+}$ (where M is selected from Al, Ga, In, and combinations thereof),
- (D) $A[In_2F_7]$:Mn$^{4+}$ (where A is selected from Li, Na, K, Rb, Cs, and combinations thereof),
- (E) $A_2[MF_6]$:Mn$^{4+}$ (where A is selected from Li, Na, K, Rb, Cs, and combinations thereof, and M is selected from Ge, Si, Sn, Ti, Zr, and combinations thereof),
- (F) $E[MF_6]$:Mn$^{4+}$ (where E is selected from Mg, Ca, Sr, Ba, Zn, and combinations thereof, and M is selected from Ge, Si, Sn, Ti, Zr, and combinations thereof),
- (G) $Ba_{0.65}Zr_{0.35}F_{2.70}$:Mn$^{4+}$, and
- (H) $A_3[ZrF_7]$:Mn$^{4+}$) where A is selected from Li, Na, K, Rb, Cs, and combinations thereof).

Time, temperature and fluorine-containing oxidizing agents for the process are described above. The amount of manganese in the Mn4+ doped precursors of formula I and groups (A)-(H), and in the product phosphors ranges from about 0.3 weight % (wt %) to about 2.5 wt %, (from about 1.2 mole % (mol %) to about 10 mol %), based on total weight of the precursor or phosphor. In some embodiments, the amount of manganese ranges from about 0.3 wt % to about 1.5 wt % (from about 1.2 mol % to about 6 mol %), particularly from about 0.50 wt % to about 0.85 wt % (from about 2 mol % to about 3.4 mol %), and more particularly from about 0.65 wt % to about 0.75 wt % (from about 2.6 mol % to about 3 mol %). In other embodiments, the amount of manganese ranges from about 0.75 wt %-2.5 wt % (about 3 mol % to about 10 mol %), particularly from about 0.9 wt % to 1.5 wt % (from about 3.5 mol % to about 6 mol %), more particularly from about 0.9 wt % to about 1.4 wt % (about 3.0 mol % to about 5.5 mol %), and even more particularly from about 0.9 wt % to about 1.3 wt % (about 3.5 mol % to about 5.1 mol %). In one particular embodiment described below, the Mn is at between 0.7 wt % and 0.9 wt %.

Figure 1:
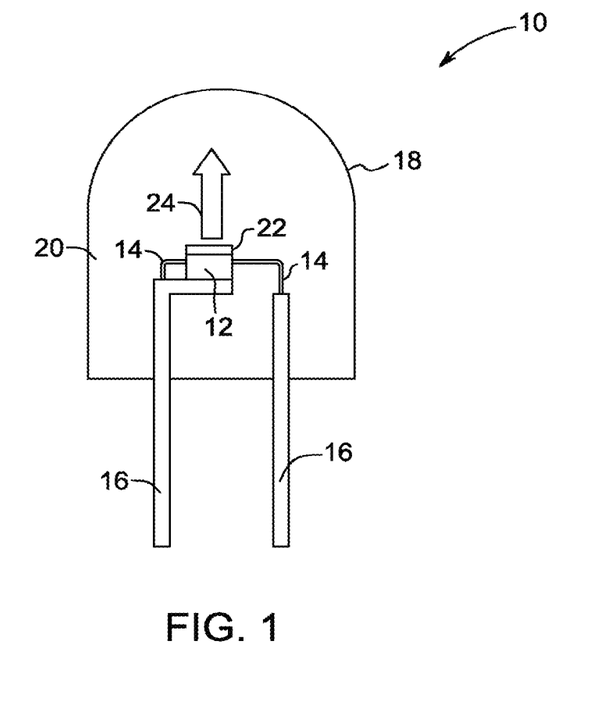
FIG. 1 is a schematic cross-sectional view of a lighting apparatus in accordance with one embodiment of the inventive subject matter.

A lighting apparatus 10 (optionally referred to as a light emitting assembly or lamp) according to one embodiment of the inventive subject matter is shown in FIG. 1. The lighting apparatus 10 includes a semiconductor radiation source, shown as an LED chip 12, and leads 14 electrically attached to the LED chip 12. The leads 14 may be thin wires supported by a thicker lead frame(s) 16 or the leads may be self-supported electrodes and the lead frame may be omitted. The leads 14 provide current to LED chip 12 and thus cause the chip to emit radiation.

The lamp may include any semiconductor blue or UV light source that is capable of producing white light when its emitted radiation is directed onto the phosphor. In one embodiment, the semiconductor light source is a blue emitting LED doped with various impurities. Thus, the LED may comprise a semiconductor diode based on any suitable III-V, II-VI or IV-IV semiconductor layers and having an emission wavelength of about 250 to 550 nm. In particular, the LED may contain at least one semiconductor layer comprising GaN, ZnSe or SiC. For example, the LED may comprise a nitride compound semiconductor represented by the formula $In_iGa_jAl_kN$ (where $0 \leq i$; $0 \leq j$; $0 \leq k$ and $i+j+k=1$) having an emission wavelength greater than about 250 nm and less than about 550 nm. In particular embodiments, the chip is a near-UV or blue emitting LED having a peak emission wavelength from about 400 to about 500 nm. The radiation source is described herein as an LED for convenience. The radiation source, however, may encompass other semiconductor radiation sources including, e.g., semiconductor laser diodes. Further, although the general discussion of the example structures of the inventive subject matter discussed herein is directed toward inorganic LED based light sources, it should be understood that the LED chip may be replaced by another radiation source unless otherwise noted and that any reference to semiconductor, semiconductor LED, or LED chip is merely representative of any appropriate radiation source, including, but not limited to, organic light emitting diodes.

In the lighting apparatus 10, a phosphor material or composition 22 is radiationally coupled to the LED chip 12. The phosphor material or composition 22 may be radiationally coupled with the LED chip 12 such that radiation from one (e.g., of the composition 22 and/or LED chip 12) is transmitted to the other. The phosphor composition 22 is deposited on the LED 12 by any appropriate method, such as a water based suspension of the phosphor(s) being formed and applied as a phosphor layer to the LED surface. In one such method, a silicone slurry in which the phosphor particles are randomly suspended is placed around the LED. This method is merely one example of possible positions of phosphor composition 22 and LED 12. Thus, phosphor composition 22 may be coated over or directly on the light emitting surface of the LED chip 12 by coating and drying the phosphor suspension over the LED chip 12. In the case of a silicone-based suspension, the suspension is cured at an appropriate temperature. Both the shell 18 and the encapsulant 20 should be transparent to allow white light 24 to be transmitted through those elements. In one or more embodiments, the D50 particle size of the phosphor composition ranges from about 1 to about 50 microns, particularly from about 10 to about 35 microns.

In other embodiments, the phosphor composition 22 is interspersed within the encapsulant material 20, instead of being formed directly on the LED chip 12. The phosphor (in the form of a powder) may be interspersed within a single region of the encapsulant material 20 or throughout the entire volume of the encapsulant material. Blue light emitted by the LED chip 12 mixes with the light emitted by phosphor composition 22, and the mixed light appears as white light. If the phosphor is to be interspersed within the material of encapsulant 20, then a phosphor powder may be added to a polymer or silicone precursor, and then the mixture may be cured to solidify the polymer or silicone material after or before loading the mixture on the LED chip 12. Examples of polymer precursors include thermoplastic or thermoset polymers or a resin, for example epoxy resin. Other phosphor interspersion methods may also be used, such as transfer loading.

In some embodiments, the encapsulant material 20 has an index of refraction R, and, in addition to phosphor composition 22, contains a diluent material having less than about 5% absorbance and index of refraction of R±0.1. The diluent material has an index of refraction of $\leq 1.7$, particularly $\leq 1.6$, and more particularly $\leq 1.5$. In particular embodiments, the diluent material is of formula II, $A_x[MF_y]$, and has an index of refraction of about 1.4. Adding an optically inactive material to the phosphor/silicone mixture may produce a more gradual distribution of light flux through the phosphor/encapsulant mixture and can result in less damage to the phosphor. Suitable materials for the diluent include fluoride compounds such as LiF, $MgF_2$, $CaF_2$, $SrF_2$, $AlF_3$, $K_2NaAlF_6$, $KMgF_3$, $CaLiAlF_6$, $K_2LiAlF_6$, and $K_2SiF_6$, which have index of refraction ranging from about 1.38 ($AlF_3$ and $K_2NaAlF_6$) to about 1.43 ($CaF_2$), and polymers having index of refraction ranging from about 1.254 to about 1.7. Non-limiting examples of polymers suitable for use as a diluent include polycarbonates, polyesters, nylons, polyetherimides, polyetherketones, and polymers derived from styrene, acrylate, methacrylate, vinyl, vinyl acetate, ethylene, propylene oxide, and ethylene oxide monomers, and copolymers thereof, including halogenated and unhalogenated derivatives. These polymer powders can be directly incorporated into silicone encapsulants before silicone curing.

In yet another embodiment, the phosphor composition 22 is coated onto a surface of the shell 18, instead of being formed over the LED chip 12. The phosphor composition is preferably coated on the inside surface of the shell 18, although the phosphor may be coated on the outside surface of the shell, if desired. The phosphor composition 22 may be coated on the entire surface of the shell or only a top portion of the surface of the shell. The UV/blue light emitted by the LED chip 12 mixes with the light emitted by phosphor composition 22, and the mixed light appears as white light. Of course, the phosphor may be located in any two or all three locations or in any other suitable location, such as separately from the shell or integrated into the LED.

Figure 2:
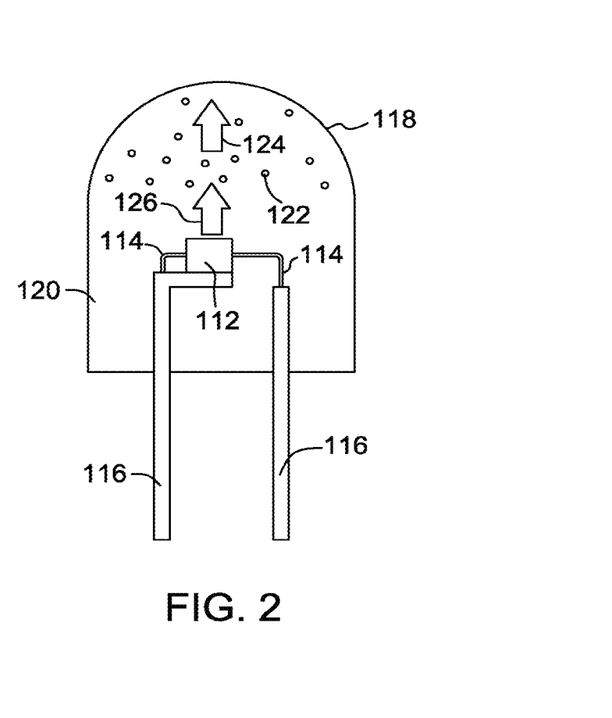
FIG. 2 is a schematic cross-sectional view of a lighting apparatus in accordance with another embodiment of the inventive subject matter.

FIG. 2 illustrates a second structure of the system according to the inventive subject matter described herein. Corresponding numbers from FIGS. 1 through 4 (e.g., 12 in FIG. 1 and 112 in FIG. 2) relate to corresponding structures in each of the figures, unless otherwise stated. The structure of the embodiment of FIG. 2 is similar to that of FIG. 1, except that the phosphor composition 122 is interspersed within the encapsulant material 120, instead of being formed directly on the LED chip 112. The phosphor (in the form of a powder) may be interspersed within a single region of the encapsulant material or throughout the entire volume of the encapsulant material. Radiation (indicated by arrow 126) emitted by the LED chip 112 mixes with the light emitted by the phosphor 122, and the mixed light appears as white light 124. If the phosphor is to be interspersed within the encapsulant material 120, then a phosphor powder may be added to a polymer precursor, and loaded around the LED chip 112. The polymer or silicone precursor may then be cured to solidify the polymer or silicone. Other known phosphor interspersion methods may also be used, such as transfer molding.

Figure 3:
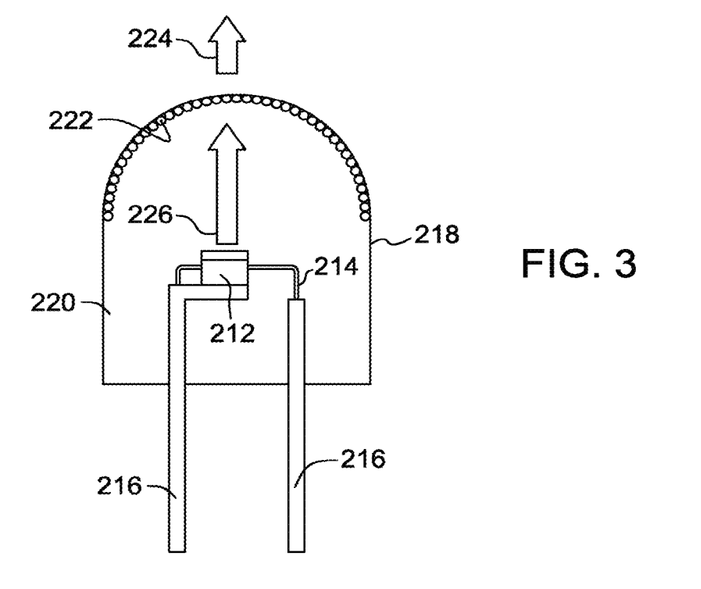
FIG. 3 is a schematic cross-sectional view of a lighting apparatus in accordance with another embodiment of the inventive subject matter.

FIG. 3 illustrates a third possible structure of the system according to the inventive subject matter described herein. The structure of the embodiment shown in FIG. 3 is similar to that of FIG. 1, except that the phosphor composition 222 is coated onto a surface of the envelope 218, instead of being formed over the LED chip 212. The phosphor composition 222 is preferably coated on the inside surface of the envelope 218, although the phosphor may be coated on the outside surface of the envelope, if desired. The phosphor composition 222 may be coated on the entire surface of the envelope, or only a top portion of the surface of the envelope. The radiation 226 emitted by the LED chip 212 mixes with the light emitted by the phosphor composition 222, and the mixed light appears as white light 224. Of course, the structures of FIGS. 1-3 may be combined, and the phosphor may be located in any two or all three locations, or in any other suitable location, such as separately from the envelope, or integrated into the LED.

In any of the above structures, the lamp may also include a plurality of scattering particles (not shown), which are embedded in the encapsulant material. The scattering particles may comprise, for example, alumina or titania. The scattering particles effectively scatter the directional light emitted from the LED chip, preferably with a negligible amount of absorption.

Figure 4:
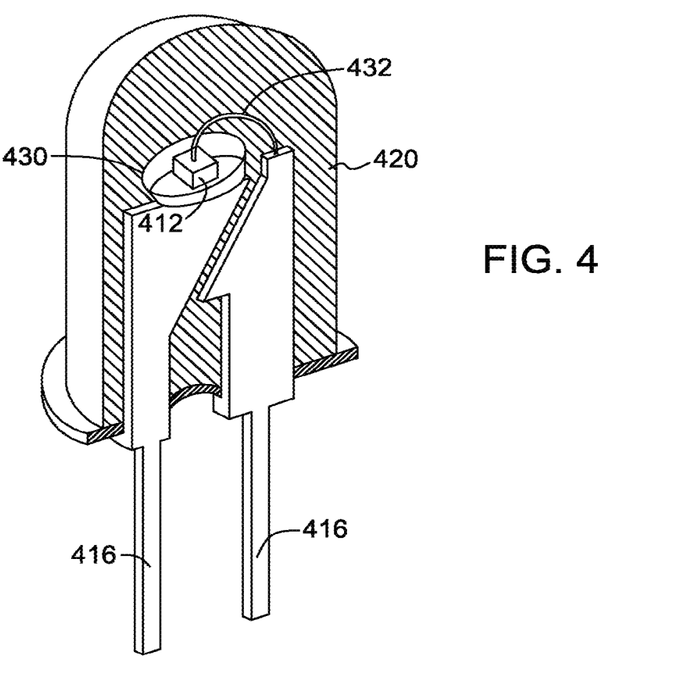
FIG. 4 is a cutaway side perspective view of a lighting apparatus in accordance with one embodiment of the inventive subject matter.

As shown in a fourth structure in FIG. 4, the LED chip 412 may be mounted in a reflective cup 430. The cup 430 may be made from or coated with a dielectric material, such as alumina, titania, or other dielectric powders known in the art, or be coated by a reflective metal, such as aluminum or silver. The remainder of the structure of the embodiment of FIG. 4 is the same as those of any of the previous figures, and can include two leads 416, a conducting wire 432, and an encapsulant material 420. The reflective cup 430 is supported by the first lead 416 and the conducting wire 432 is used to electrically connect the LED chip 412 with the second lead 416.

Figure 5:
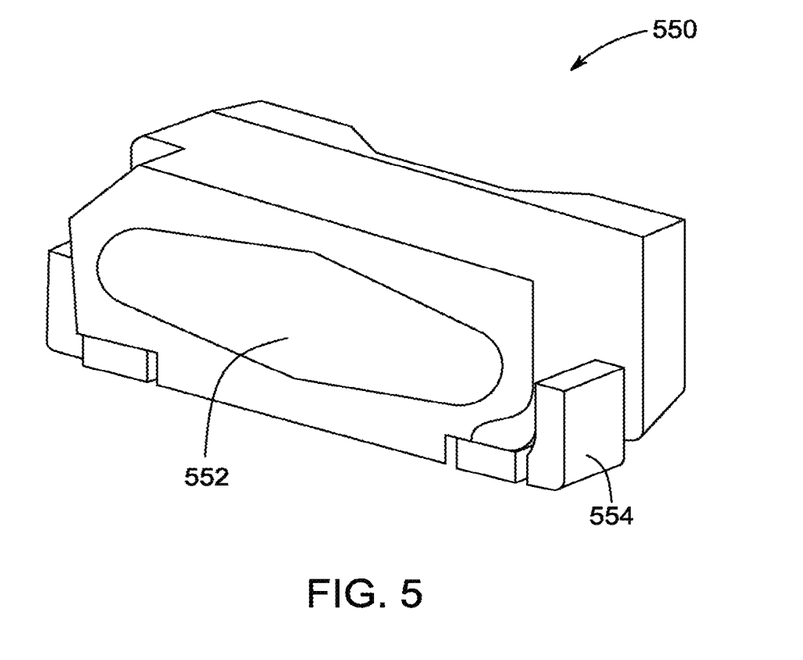
FIG. 5 is a schematic perspective view of a surface-mounted device (SMD) backlight LED.

Another structure (particularly for backlight applications) is a surface mounted device ("SMD") type light emitting diode 550, e.g. as illustrated in FIG. 5. This SMD is a "side-emitting type" and has a light-emitting window 552 on a protruding portion of a light guiding member 554. An SMD package may comprise an LED chip as defined above, and a phosphor material that is excited by the light emitted from the LED chip. Other backlight devices include, but are not limited to, TVs, computers, monitors, smartphones, tablet computers and other handheld devices that have a display including a semiconductor light source; and a $Mn^{4+}$ doped phosphor according to the inventive subject matter.

When used with an LED emitting at from 350 to 550 nm and one or more other appropriate phosphors, the resulting lighting system will produce a light having a white color. Lamp 10 may also include scattering particles (not shown), which are embedded in the encapsulant material. The scattering particles may comprise, for example, alumina or titania. The scattering particles effectively scatter the directional light emitted from the LED chip, preferably with a negligible amount of absorption.

In addition to the $Mn^{4+}$ doped phosphor, phosphor composition 22 may include one or more other phosphors. When used in a lighting apparatus in combination with a blue or near UV LED emitting radiation in the range of about 250 to 550 nm, the resultant light emitted by the assembly will be a white light. Other phosphors such as green, blue, yellow, red, orange, or other color phosphors may be used in the blend to customize the white color of the resulting light and produce specific spectral power distributions. Other materials suitable for use in phosphor composition 22 include electroluminescent polymers such as polyfluorenes, preferably poly(9,9-dioctyl fluorene) and copolymers thereof, such as poly(9,9'-dioctylfluorene-co-bis-N,N'-(4-butylphenyl)diphenylamine) (F8-TFB); poly(vinylcarbazole) and polyphenylenevinylene and their derivatives. In addition, the light emitting layer may include a blue, yellow, orange, green or red phosphorescent dye or metal complex, or a combination thereof. Materials suitable for use as the phosphorescent dye include, but are not limited to, tris(1-phenylisoquinoline) iridium (III) (red dye), tris(2-phenylpyridine) iridium (green dye) and Iridium (III) bis(2-(4, 6-difluorophenyl)pyridinato-N,C2) (blue dye). Commercially available fluorescent and phosphorescent metal complexes from ADS (American Dyes Source, Inc.) may also be used. ADS green dyes include ADS060GE, ADS061GE, ADS063GE, and ADS066GE, ADS078GE, and ADS090GE. ADS blue dyes include ADS064BE, ADS065BE, and ADS070BE. ADS red dyes include ADS067RE, ADS068RE, ADS069RE, ADS075RE, ADS076RE, ADS067RE, and ADS077RE.

Suitable phosphors for use in phosphor composition 22 include, but are not limited to:

$((Sr_{1-z}(Ca, Ba, Mg, Zn)_z)_{1-(x+w)}(Li, Na, K, Rb)_w Ce_x)_3 (Al_{1-y}Si_y)O_{4+y+3(x-w)}F_{1-y-3(x-w)}$, where $0 \leq x \leq 0.10$, $0 \leq y \leq 0.5$, $0 \leq z \leq 0.5$, and $0 \leq w \leq x$;

(Ca, Ce)$_3$Sc$_2$Si$_3$O$_{12}$(CaSiG);
(Sr, Ca, Ba)$_3$Al$_{1-x}$Si$_x$O$_{4+x}$F$_{1-x}$:Ce$^{3+}$ (SASOF));
(Ba, Sr, Ca)$_5$(PO$_4$)$_3$(C$_1$,F,Br,OH):Eu$^{2+}$,Mn$^{2+}$;
(Ba, Sr, Ca)BPO$_5$:Eu$^{2+}$, Mn$^{2+}$;
(Sr, Ca)$_{10}$(PO$_4$)$_6$*vB$_2$O$_3$:Eu$^{2+}$ (where $0 \leq v \leq 1$);
Sr$_2$Si$_3$O$_8$*2SrCl$_2$:Eu$^{2+}$;
(Ca, Sr, Ba)$_3$MgSi$_2$O$_8$:Eu$^{2+}$,Mn$^{2+}$;
BaAl$_8$O$_{13}$:Eu$^{2+}$;
2SrO*0.84P$_2$O$_5$*0.16B$_2$O$_3$:Eu$^{2+}$;
(Ba, Sr, Ca)MgAl$_{10}$O$_{17}$:Eu$^{2+}$, Mn$^{2+}$;
(Ba, Sr, Ca)Al$_2$O$_4$:Eu$^{2+}$;
(Y, Gd, Lu, Sc, La)BO$_3$:Ce$^{3+}$, Tb$^{3+}$;
ZnS:Cu$^+$,Cl$^-$;
ZnS:Cu$^+$,Al$^{3+}$;
ZnS:Ag$^+$,Cl$^-$;
ZnS:Ag$^+$,Ag$^{3+}$;
(Ba, Sr, Ca)$_2$Si$_{1-\xi}$O$_{4-2\xi}$:Eu$^{2+}$ (where $0.2 \leq \xi \leq 0.2$);
(Ba, Sr, Ca)$_2$(Mg, Zn)Si$_2$O$_7$:Eu$^{2+}$;
(Sr, Ca, Ba)(Al, Ga, In)$_2$S$_4$:Eu$^{2+}$;
(Y, Gd, Tb, La, Sm, Pr, Lu)$_3$(Al, Ga)$_{5-\alpha}$O$_{12-3/2\alpha}$:Ce3+ (where $0 \leq \alpha \leq 0.5$);
(Ca, Sr)$_8$(Mg, Zn)(SiO$_4$)$_4$Cl$_2$:Eu$^{2+}$, Mn$^{2+}$;
Na$_2$Gd$_2$B$_2$O$_7$:Ce$^{3+}$, Tb$^{3+}$;
(Sr, Ca, Ba, Mg, Zn)$_2$P$_2$O$_7$:Eu$^{2+}$,Mn$^{2+}$;
(Gd, Y, Lu, La)$_2$O$_3$:Eu$^{3+}$,Bi$^{3+}$;
(Gd, Y, Lu, La)$_2$O$_2$S:Eu$^{3+}$,Bi$^{3+}$;
(Gd, Y, Lu, La)VO$_4$:Eu$^{3+}$,Bi$^{3+}$;
(Ca, Sr)S:Eu$^{2+}$, Ce$^{3+}$;
SrY$_2$S$_4$:Eu$^{2+}$;
CaLa$_2$S$_4$:Ce$^{3+}$;
(Ba, Sr, Ca)MgP$_2$O$_7$:Eu$^{2+}$, Mn$^{2+}$;
(Y, Lu)$_2$WO$_6$:Eu$^{3+}$,Mo$^{6+}$;
(Ba, Sr, Ca)$_\beta$Si$_\gamma$N$_\mu$:Eu$^{2+}$ (where $2\beta+4\gamma=3\mu$);
(Ba, Sr, Ca)$_2$Si$_{5-x}$Al$_x$N$_{8-x}$O$_x$:Eu$^{2+}$ (where $0 \leq x \leq 2$);
Ca$_3$(SiO$_4$)Cl$_2$:Eu$^{2+}$;
(Lu, Sc, Y, Tb)$_{2-u-v}$Ce$_v$Ca$_{1+u}$Li$_w$Mg$_{2-w}$P$_w$(Si, Ge)$_{3-w}$O$_{12-u/2}$ (where $0.5 \leq u \leq 1$, $0 \leq v \leq 0.1$, and $0 \leq w \leq 0.2$);
(Y, Lu, Gd)$_{2-\varphi}$Ca$_\varphi$Si$_4$N$_{6+\varphi}$C$_{1-\varphi}$:Ce$^{3+}$, (where $0 \leq \varphi \leq 0.5$);
(Lu, Ca, Li, Mg, Y), α-SiAlON doped with Eu$^{2+}$ and/or Ce$^{3+}$;
(Ca, Sr, Ba)SiO$_2$N$_2$:Eu$^{2+}$, Ce$^{3+}$;
β-SiAlON:Eu$^{2+}$, 3.5MgO*0.5MgF$_2$*GeO$_2$:Mn$^{4+}$;
(Sr, Ca, Ba)AlSiN$_3$:Eu$^{2+}$;
(Sr, Ca, Ba)$_3$SiO$_5$:Eu$^{2+}$;
Ca$_{1-c-f}$Ce$_c$Eu$_f$Al$_{1+c}$Si$_{1-c}$N$_3$, (where $0 \leq c \leq 0.2$, $0 \leq f \leq 0.2$);
Ca$_{1-h-r}$Ce$_h$Eu$_r$Al$_{1-h}$(Mg, Zn)$_h$SiN$_3$, (where $0 \leq h \leq 0.2$, $0 \leq r \leq 0.2$);
Ca$_{1-2s-t}$Ce$_s$(Li, Na)$_s$Eu$_t$AlSiN$_3$, (where $0 \leq s \leq 0.2$, $0 \leq f \leq 0.2$, s+t>0); and/or
Ca$_{1-\sigma-\chi-\Phi}$Ce$_\sigma$.(Li, Na)$_\chi$.Eu$_\Phi$.Al$_{1+\sigma-\sigma-\chi}$Si$_{1-\sigma+\chi}$N$_3$, (where $0 \leq \sigma \leq 0.2$, $0 \leq \chi \leq 0.4$, $0 \leq \Phi \leq 0.2$).

The ratio of each of the individual phosphors in the phosphor blend may vary depending on the characteristics of the desired light output. The relative proportions of individual phosphors in the various embodiment phosphor blends may be adjusted such that when their emissions are blended and employed in an LED lighting device, there is produced visible light of predetermined x and y values on the CIE chromaticity diagram. As stated, a white light is preferably produced. This white light may, for instance, may possess an x value in the range of about 0.20 to about 0.55, and a y value in the range of about 0.20 to about 0.55. As stated, however, the exact identity and amounts of each phosphor in the phosphor composition can be varied according to the needs of the end user. For example, the material can be used for LEDs intended for liquid crystal display (LCD) backlighting. In this application, the LED color point would be appropriately tuned based upon the desired white, red, green, and blue colors after passing through an LCD/color filter combination. The list of potential phosphor for blending given here is not meant to be exhaustive and these Mn$^{4+}$-doped phosphors can be blended with various phosphors with different emission to achieve desired spectral power distributions.

The Mn$^{4+}$ doped phosphors of the inventive subject matter described herein may be used in applications other than those described above. For example, the material may be used as a phosphor in a fluorescent lamp, in a cathode ray tube, in a plasma display device or in a liquid crystal display (LCD). The material may also be used as a scintillator in an electromagnetic calorimeter, in a gamma ray camera, in a computed tomography scanner or in a laser. These uses are merely examples and are not limiting on all embodiments of the inventive subject matter described herein.

EXAMPLES

The examples that follow are merely illustrative, and should not be construed to be any sort of limitation on the scope of all embodiments of the claimed subject matter.

Manganese (Mn$^{4+}$) doped K$_2$SiF$_6$ were synthesized according to a procedure described in the referenced U.S. Pat. No. 7,497,973, in a HF solution with a drying temperature of about 70 degrees Celsius.

72.6 microns D50 particles of K$_2$SiF$_6$:Mn$_{4+}$ were ball milled in acetone for 20 minutes. Table 1 shows a drop in quantum efficiency of K$_2$SiF$_6$:Mn$^{4+}$ after milling for 5 minutes and 20 minutes as compared to the as-synthesized K$_2$SiF$_6$:Mn$^{4+}$.

TABLE 1

| Sample milling period (minutes) | D50 particle size (microns) | QE (relative) | Abs |
|---|---|---|---|
| 0 (As-synthesized) | 72.6 | 100% | 90% |
| 5 | 61.7 | 94% | 89% |
| 20 | 22.3 | 86% | 70% |

Example 1

15 g of manganese-doped potassium fluorosilicate (PFS: Mn) precursor, K$_2$SiF$_6$:Mn$^{4+}$ having particles of D50 particle size of 46 microns and containing 0.76 wt % Mn based on total weight of the precursor material, was added to 250 milliliters NALGENE bottle containing dry milling media and sealed in the bottle. The bottle was placed on a roller mill for 15 minutes. The milled precursor was removed from the bottle, which had D50 particles of 16 microns. The milled precursor particles were then placed in a furnace chamber. The furnace chamber was evacuated and was filled with an atmosphere containing 20% F$_2$/80% N$_2$. The chamber was then heated up to 540° C. After annealing the precursor for 8 hours, the chamber was cooled to room temperature. The fluorine nitrogen mixture was evacuated; the chamber was filled and purged several times with nitrogen to ensure the complete removal of fluorine gas before opening the chamber. The annealed PFS powder was then treated with a saturated solution of $K_2SiF_6$ by placing the powder (~10 g) in a Teflon beaker containing 100 mL of a saturated solution of $K_2SiF_6$ (initially made by adding ~5 g of $K_2SiF_6$ in 40% HF at room temperature, stirring, and filtering the solution). The suspension was stirred slowly, filtered, washed in acetone 3-5 times and the filtrate was dried under vacuum.

Example 2

15 g of manganese-doped potassium fluorosilicate (PFS:Mn) precursor, $K_2SiF_6:Mn^{4+}$ having particles of D50 particle size of 46 microns and containing 0.76 wt % Mn based on total weight of the precursor material, was added to 250 milliliters NALGENE bottle containing dry milling media and sealed in the bottle. The bottle was placed on a roller mill for 15 minutes. The milled precursor was removed from the bottle, which had D50 particles between 24 microns and 30 microns. Table 2 shows that after milling the QE of the PFS:Mn precursor was decreased. The milled precursor particles were then placed in a furnace chamber. The furnace chamber was evacuated and was filled with an atmosphere containing 20% $F_2$/80% $N_2$. The chamber was then heated up to 540° C. After annealing the precursor for 8 hours, the chamber was cooled to room temperature. The fluorine nitrogen mixture was evacuated; the chamber was filled and purged several times with nitrogen to ensure the complete removal of fluorine gas before opening the chamber. The annealed PFS powder was then treated (wet treatment) with a saturated solution of $K_2SiF_6$ by placing the powder (~10 g) in a Teflon beaker containing 100 mL of a saturated solution of $K_2SiF_6$ (initially made by adding ~5 g of $K_2SiF_6$ in 40% HF at room temperature, stirring, and filtering the solution). The suspension was stirred slowly, filtered, washed in acetone 3-5 times and the filtrate was dried under vacuum.

Table 2 shows quantum efficiency (QE) and stability (tested under conditions of high flux) of the PFS samples of example 1 and example 2 along with a commercially available phosphor of $K_2SiF_6$:Mn (Comparative example). The milled and post-treated sample showed increased quantum efficiency (QE) and lifetime, and experienced significantly less damage compared to the PFS of the comparative example as well as as-synthesized PFS sample. It was also observed for example 2 that annealing improved the QE of the PFS powder by 23%-28%, decreased the absorbance at 300 nm, and increased the lifetime. Furthermore, the wet treatment improved the HTHH stability. HTHH damage or loss was improved from more than 45% to less than 10%.

TABLE 2

| Sample | | Particle size D50 (μm) | QE (%) | LD (%) | Life-time (ms) | Power Red (mW) |
|---|---|---|---|---|---|---|
| Comparative Example | | 27 | 100 | 7 | 8.6 | 76 |
| Example 1 | As synthesized PFS | 46 | 97 | — | 8.35 | — |
| | Milled/post treated | 16 | 104 | 1.4 | 8.9 | 93 |

| Sample | | D10/D50/D90 | QE (%) | LD (%) | Life-time (ms) | HTHH loss |
|---|---|---|---|---|---|---|
| Example 2 | As synthesized | 14/58/67 | 87.9% | 8.146 | 8.146 | — |

TABLE 2-continued

| | | | | | |
|---|---|---|---|---|---|
| PFS Milled | | 80.8% | 8.142 | 8.142 | 54% |
| Milled/post treated | 18/28/39 | 103.0% | 8.698 | 8.698 | 7% |

One or more embodiments of the inventive subject matter described above involve manufacturing processes for PFS that involve synthesizing phosphor powders or particles, followed by milling the powders or particles, followed by annealing the milled powders or particles, and then followed by treating surfaces of the annealed powders or particles. Alternatively, this process can be modified as described below to provide phosphors that are able to withstand HTHH or other environmental conditions better than the process described above, while also providing the same, better, or approximately the same QE as the process described above.

For example, as described above, a phosphor precursor may be obtained (e.g., synthesized, such as using formula I) and milled into particles (e.g., using ball milling with or without a liquid medium). The milled particles can then be annealed by contacting the milled particles with an oxidizing agent that includes fluorine at an elevated temperature. The annealed particles may then be treated with a solution (e.g., a saturated solution of formula II). This treatment can reduce surface defects on the annealed particles. One or more additional embodiments of the inventive subject matter described herein change this manufacturing process to improve the durability and performance of phosphors formed from the particles relative to the preceding process.

Figure 6:
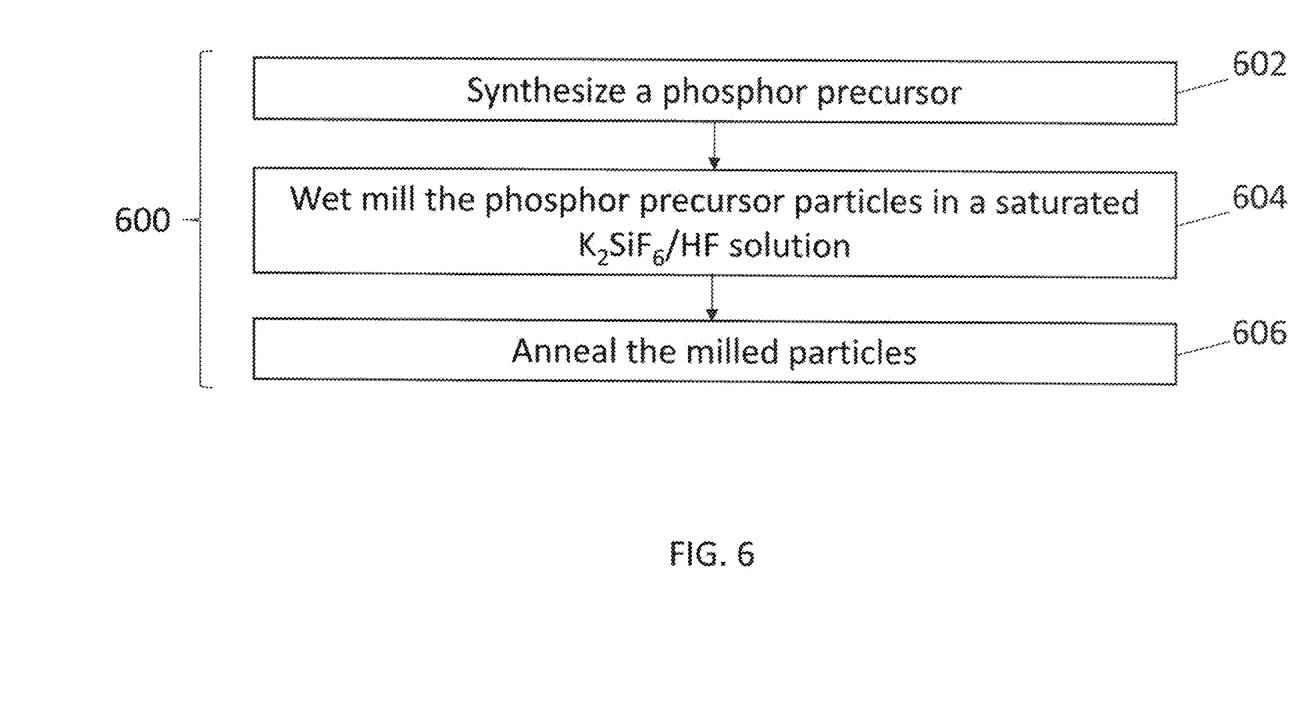
FIG. 6 illustrates a flowchart of one embodiment of a method for providing phosphor particles.

FIG. 6 illustrates a flowchart of another embodiment of a method 600 for providing phosphor particles. The method 600 may be used to manufacture phosphor particles that can be embedded in an encapsulant or otherwise used to create a phosphor for use in one or more light assemblies or lamps described herein. At 602, a phosphor precursor is synthesized. As described above, a phosphor precursor for a tetravalent manganese doped phosphor may be created using the formula I. The phosphor precursor particles can be synthesized by mixing solutions that include sources of potassium, silicon, and manganese, and then precipitating $K_2SiF_6$:Mn particles from the mixture. These particles and remaining mixture are filtered to separate the solid particles from the liquid. These particles can then be rinsed in acetone or other solvent, and dried to provide the phosphor precursor particles. The precursor may be synthesized as powders or particles of various sizes. In one embodiment, at least some of the particles of the phosphor precursor have a D50 of 30 microns or larger (e.g., medium value of particle size distribution being equal to or bigger than thirty microns).

At 604, the particles are wet milled to reduce the sizes of the particles to a designated size or designated range of sizes. The particles may be milled using wet ball milling or another milling technique. Wet ball milling can involve mixing the phosphor precursor particles with a solution, including saturated $K_2SiF_6$ in HF solution, placing the mixture into a container with milling balls which are inert to the solution, and rotating the container to mill or grind the particles down to specified smaller sizes.

Figure 7:
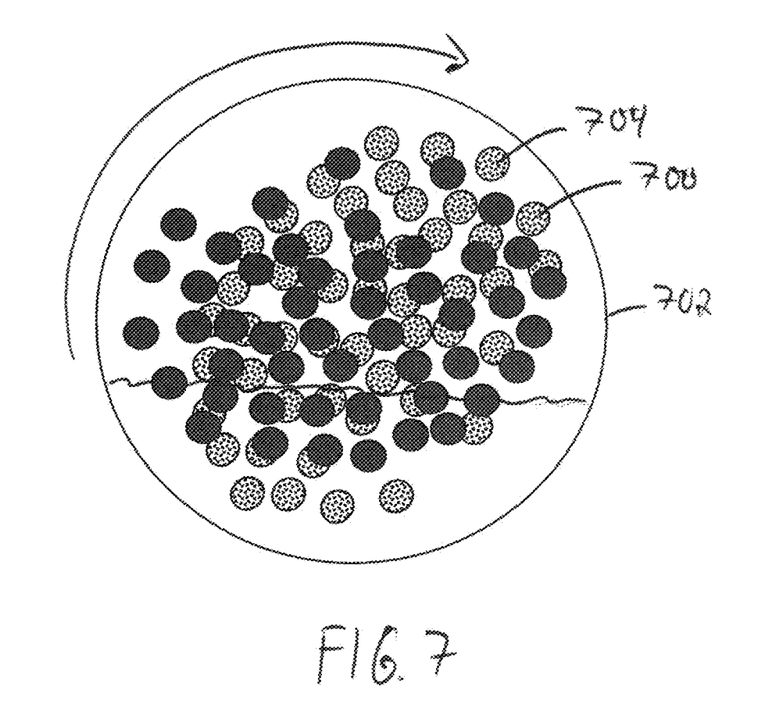
FIG. 7 schematically illustrates another example of milling the phosphor precursor powders or particles.

FIG. 7 schematically illustrates one example of milling the phosphor precursor powders or particles. Phosphor precursor particles 700 are mixed with a solution that is placed inside a rolling container 702, which is prefilled with milling balls 704 which occupy the container by about one third to one half of the total volume. In one embodiment, saturated $K_2SiF_6$ solution is prepared at room temperature (initially made by adding $K_2SiF_6$ in 40% HF at room temperature, stirring, and filtering the solution) to form a milling solution. An amount of the phosphor precursor particles (e.g., eighty milligrams or another amount) is mixed with the milling balls 704 (e.g., sixty grams of the milling balls or another amount) and the saturated milling solution (e.g., 240 milliliters of the saturated $K_2SiF_6$/HF solution or another amount) in the container 702 (e.g., a 250 milliliter capacity NALGENE bottle or another type of container). The milling balls 704 may be formed from a material that does not react with the precursor particles 700, such a polytetrafluoroethylene (PTFE) balls. The container 702 is rotated to cause the balls 704 to move within the container 702 and grind or mill the particles 700. In one embodiment, the container 702 is placed onto a lab roller manufactured by U.S. Stoneware Corp. with the rolling speed set to 70% or another speed. The rotating of the container 702 changes the sizes of the particles 700 to a designated size or within a designated range, such as D50 particle size less than 30 microns, such as from 10 microns to 20 microns, or from 12 microns to 18 microns. In one embodiment, the particles 700 are wet milled until the particles are no larger than 22 microns. Alternatively, the particles 700 are milled to another size. The rolling of the container 702 may continue for a period of time needed to reduce the particles 700 to no larger than the designated size or within the designated range, such as four hours or another length of time.

At 606, the milled particles are annealed. The particles can be annealed by placing the particles into contact with a fluorine-containing oxidizing agent in gaseous form at an elevated temperature. The fluorine-containing oxidizing agent may be $F_2$, $AlF_3$, $SbF_5$, $ClF_3$, $BrF_3$, KrF, $XeF_2$, $XeF_4$, $NF_3$, $SiF_4$, $PbF_2$, $ZnF_2$, $SnF_2$, $CdF_2$, or a combination thereof. The particles can be placed into contact with the fluorine-containing oxidizing agent at temperatures of at least 200 degrees Celsius to 700 degrees Celsius, or another temperature. Alternatively, the particles can be placed into contact with the fluorine-containing oxidizing agent at temperatures of at least 350 degrees Celsius to 600 degrees Celsius, or another temperature, such as at least 100 degrees Celsius, at least 225 degrees Celsius, or at least 350 degrees Celsius. The time period during which the particles are placed into contact with the fluorine-containing oxidizing agent at the elevated temperatures can vary based on the temperature. For example, for hotter temperatures, the annealing time may decrease while, for cooler temperatures, the annealing time may increase.

Wet milling the particles in saturated $K_2SiF_6$/HF solution by a process described above may increase the durability of the phosphors created from the particles obtained using the method 600 relative to particles formed by milling the phosphor precursor particles differently. Table 3 below illustrates normalized QE for several different samples of phosphor precursor particles prior to exposure to HTHH, after exposure to HTHH for forty-seven hours, and the difference in normalized QE before and after this HTHH exposure. Both samples are milled down to the same particle size of D50 being 22 microns using different method, starting from a same batch of synthesized precursors. The sample labeled JH-BM-A5 (control) is formed by synthesizing the particles (e.g., 602), then dry milling the particles, then annealing the particles (e.g., 606), and then treating the surfaces of the particles. The dry milling of the control sample was performed by mixing the $K_2SiF_6$:Mn phosphor precursor powders and cesium-stabilized $ZrO_2$ milling stones in a ratio of 90 grams of the precursor powders to four hundred grams of the milling stones and capping this mixture in a 250 milliliter NALGENE bottle. The bottle was then placed on a lab roller manufactured by U.S. Stoneware Corp., with speed dial set at 70%. The remaining samples (JH-BM-C2 (test) in Table 3) were prepared using the method 600, namely wet milling in saturated $K_2SiF_6$/HF solution using PTFE balls in a capped NALGENE bottle.

The HTHH exposure of the samples involved incorporating the particles of the different samples into a two-part silicone, which could be RTV615 from Momentive Performance Materials Inc., with 50 to 75% phosphor loading to create silicone/phosphor particle composite samples. These samples were then poured into Al plaque holders with a small indentation. Emission and reflectance (versus a $BaSO_4$ standard) under 450 nm excitation were measured for each sample. Some of the plaques are reserved and stored under dry nitrogen as control samples. The other plaques are aged at about 80° C. and at about 80% relative humidity, and after a fixed time, spectra of the exposed and control plaque intensities are re-measured. The QE is calculated and compared to a standard sample, with relative values reported herein. The comparison of the QE before and after aging is a measure of the degradation of the sample which indicates HTHH reliability of the phosphor during product application. The less the decrease in QE, the better is the HTHH reliability.

TABLE 3

| HTHH (80° C./85% RH) Powder | 0 hr QE | 47 hr QE | Decrease QE |
| --- | --- | --- | --- |
| JH-BM-A5 (control) | 100.00% | 86.00% | 14.00% |
| JH-BM-A5 (control) | 100.00% | 86.80% | 13.20% |
| JH-BM-C2 (test) | 100.00% | 90.90% | 9.10% |
| JH-BM-C2 (test) | 100.00% | 92.00% | 8.00% |

Figure 9:
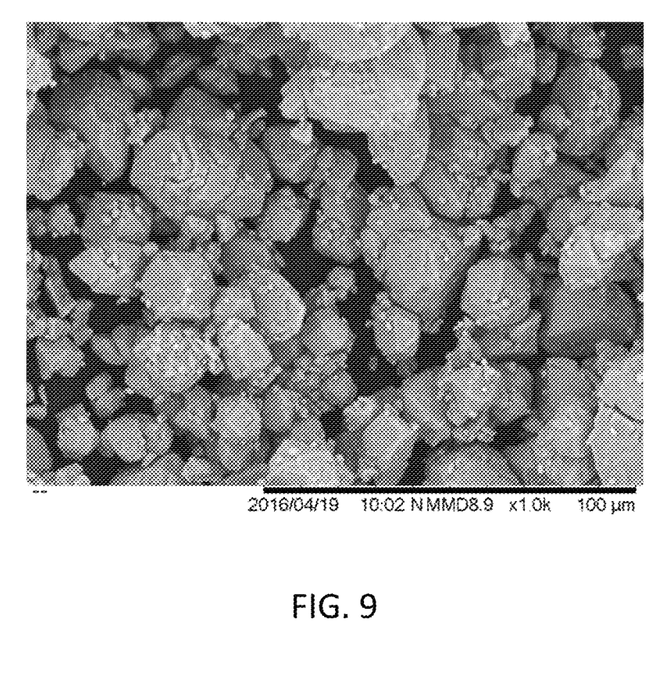
FIGS. 9-12 are scanning electron microscope (SEM) images of various samples of phosphor particles using a secondary electron mode.
Figure 10:
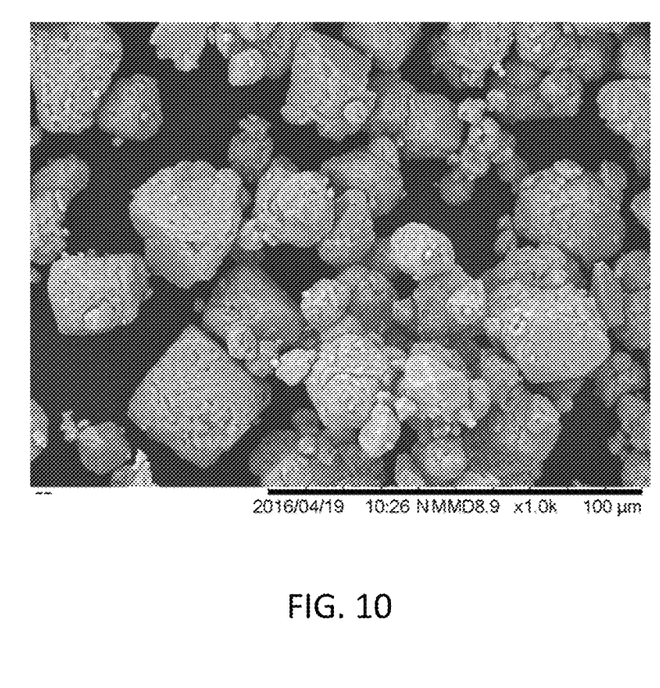

FIG. 9 is a scanning electron microscope (SEM) image of the JH-BM-A5 (control) sample. FIG. 10 is an SEM image of the JH-MN-C2 (test) sample. As shown in Table 3, the normalized QE of all samples decreased after the exposure of the powders to HTHH for 47 hours, but the samples that were wet milled (e.g., JH-BM-C2) decreased by significantly less. The largest decrease in QE of all of the powders prepared by wet milling the powders according to the method 600 is 9.10% while the smallest decrease in QE of the powders prepared using the method 600 is 8.00%. The powders prepared without wet milling, however, experienced a decrease in QE of 13.2% or 14.0%.

Optionally, the wet milling operation of 604 may be performed for a longer time period (e.g., ten hours instead of four hours) to further reduce the sizes of the phosphor precursor particles. Performing the wet milling for longer can reduce the particle sizes of the phosphor precursor to no larger than fifteen microns. The longer wet milling process also further increases the reliability of the phosphor precursor relative to other methods for manufacturing the phosphor precursor.

Table 4 below illustrates normalized QE for several different samples of phosphor precursor particles prior to exposure to HTHH, after exposure to HTHH for forty-seven hours, and the difference in normalized QE before and after this HTHH exposure. The samples BM Test Cell F were prepared using the method 600, but with wet milling the particles for ten hours to result in a smaller particle size of D50 being 15 microns.

TABLE 4

| HTHH (80° C./85% RH) Powder | 0 hr QE | 47 hr QE | Decrease QE |
|---|---|---|---|
| BM Test Cell F | 100.00% | 95.37% | 4.63% |
| BM Test Cell F | 100.00% | 95.39% | 4.61% |

Figure 11:
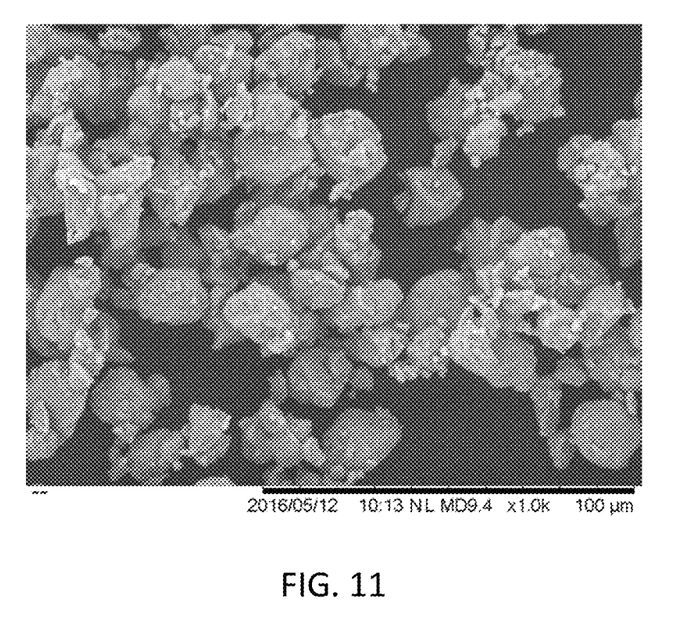

FIG. 11 is an SEM image of the BM Test Cell F sample. As shown in Table 4, the largest decrease in QE of the sample. prepared by wet milling the powders according to the method 600, but for a longer period of time, is about 4.6% on average. As described above, the powders prepared without wet milling or with wet milling for a shorter time period experienced larger decreases in QE.

The wet milling of the phosphor precursor particles may increase the reliability and performance of the particles over time due to removal of manganese from exterior surfaces of the particles. The manganese used to dope the phosphor particles may be present both inside the particles and on exterior surfaces of the particles as synthesized. During exposure of the phosphor particles to moisture, the manganese may degrade and decrease the QE of the particles. The wet milling in saturated $K_2SiF_6$/HF solution may both remove the exterior manganese and decrease the sizes of the particles, and the manganese located inside the particles may be protected from the moisture. As a result, the wet milling process as described herein can manufacture phosphors of small particle size, remove manganese from the exterior particle surface leaving manganese inside the particles core, allow the particles to operate as a phosphor and improve its HTHH reliability.

Figure 8:
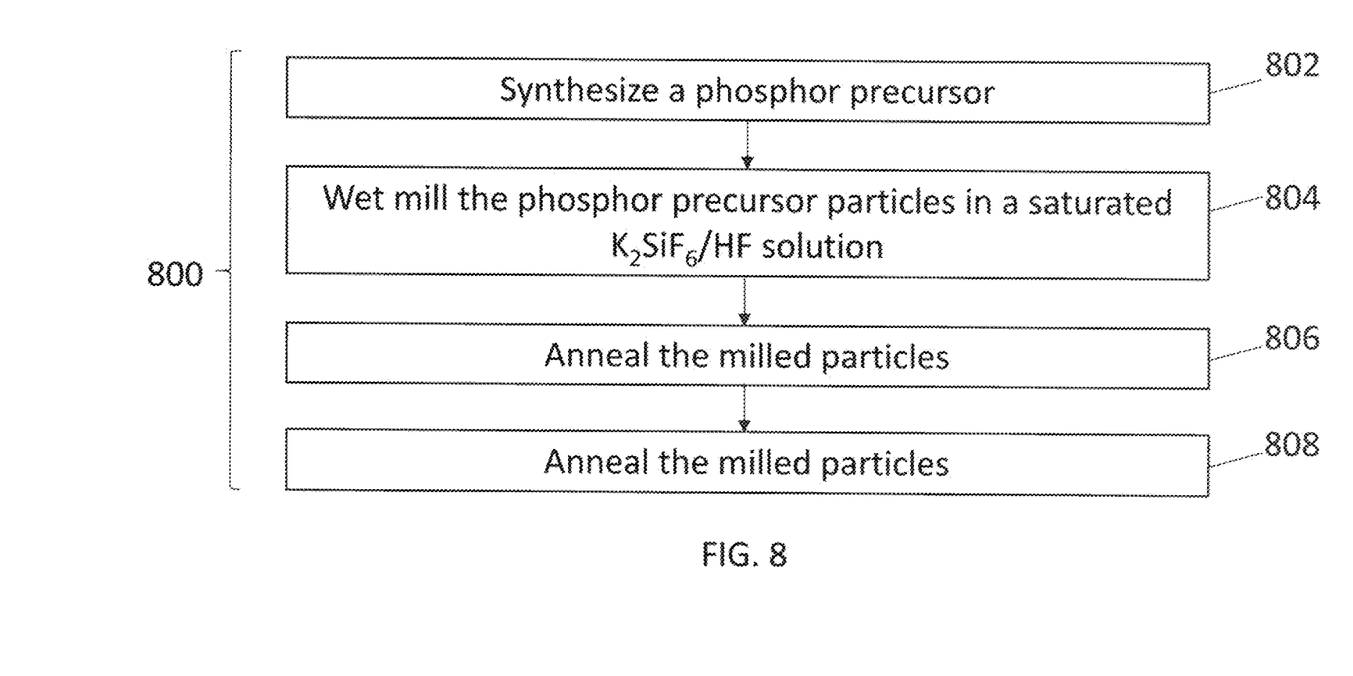
FIG. 8 illustrates a flowchart of yet another embodiment of a method for providing phosphor particles.

FIG. 8 illustrates a flowchart of another embodiment of a method 800 for providing phosphor particles. The method 800 may be used to manufacture phosphor particles that can be embedded in an encapsulant or otherwise used to create a phosphor for use in one or more light assemblies or lamps described herein. At 802, a phosphor precursor is synthesized. As described above, a phosphor precursor for a tetravalent manganese doped phosphor may be created using the formula I. The phosphor precursor particles can be synthesized by mixing solutions that include sources of potassium, silicon, and manganese, and then precipitating $K_2SiF_6$:Mn particles from the mixture. These particles and remaining mixture are filtered to separate the solid particles from the liquid. These particles can then be rinsed in acetone or other solvent and dried to provide the phosphor precursor particles. The precursor may be synthesized as powders or particles of various sizes. In one embodiment, at least some of the particles of the phosphor precursor have a of 30 microns or larger (e.g., medium value of particle size distribution being equal to or bigger than thirty microns)

At 804, the particles are wet milled to reduce the sizes of the particles to a designated size or designated range of sizes. The particles may be milled using wet ball milling or another milling technique. Wet ball milling can involve mixing the phosphor precursor particles with a saturated $K_2SiF_6$/HF solution, placing the mixture into a container with milling balls inert to HF solution, and rotating the container to mill or grind the particles down to smaller sizes. The particles may be wet milled as described above in connection with the method 600.

At 806, the milled particles are annealed. The particles can be annealed by placing the particles into contact with a fluorine-containing oxidizing agent in gaseous form at an elevated temperature. The fluorine-containing oxidizing agent may be $F_2$, $AlF_3$, $SbF_5$, $ClF_3$, $BrF_3$, $KrF$, $XeF_2$, $XeF_4$, $NF_3$, $SiF_4$, $PbF_2$, $ZnF_2$, $SnF_2$, $CdF_2$, or a combination thereof. The particles can be placed into contact with the fluorine-containing oxidizing agent at temperatures of at least 200 degrees Celsius to 700 degrees Celsius, or another temperature. Alternatively, the particles can be placed into contact with the fluorine-containing oxidizing agent at temperatures of at least 350 degrees Celsius to 600 degrees Celsius, or another temperature, such as at least 100 degrees Celsius, at least 225 degrees Celsius, or at least 350 degrees Celsius. The time period during which the particles are placed into contact with the fluorine-containing oxidizing agent at the elevated temperatures can vary based on the temperature. For example, for hotter temperatures, the annealing time may decrease while, for cooler temperatures, the annealing time may increase.

At 808, the particles are annealed again. The particles can be annealed again by placing the particles back into contact with a fluorine-containing oxidizing agent in gaseous form at an elevated temperature. The agent and temperature used for the annealing may be the same as was used at 806, or a different agent and/or temperature may be used.

Wet milling the particles and using an additional annealing operation may increase the durability of the phosphors created from the particles obtained using the method 800 relative to particles formed without wet milling the phosphor precursor particles or relative to particles formed without wet milling and using the additional annealing operation. Table 5 below illustrates normalized QE for several different samples of phosphor precursor particles prior to exposure to HTHH, after exposure to HTHH for forty-seven hours, and the difference in normalized QE before and after this HTHH exposure. The samples labeled JH-BM-A5 (control) are formed by synthesizing the particles (e.g., 602), then dry milling the particles (as described above in connection with Table 3), then annealing the particles (e.g., 606) a single time. The remaining samples (JH-BM-05 (test) in Table 5) were prepared using the method 800. Both samples are milled down to the same particle size of D50 being 22 microns, starting from a same batch of synthesized precursors

TABLE 5

| HTHH (80° C./85% RH) Powder | 0 hr QE | 47 hr QE | Decrease QE |
|---|---|---|---|
| JH-BM-A5 (control) | 100.00% | 86.00% | 14.00% |
| JH-BM-A5 (control) | 100.00% | 86.80% | 13.20% |
| JH-BM-C5 (test) | 100.00% | 91.40% | 8.60% |
| JH-BM-C5 (test) | 100.00% | 90.30% | 9.70% |

Figure 12:
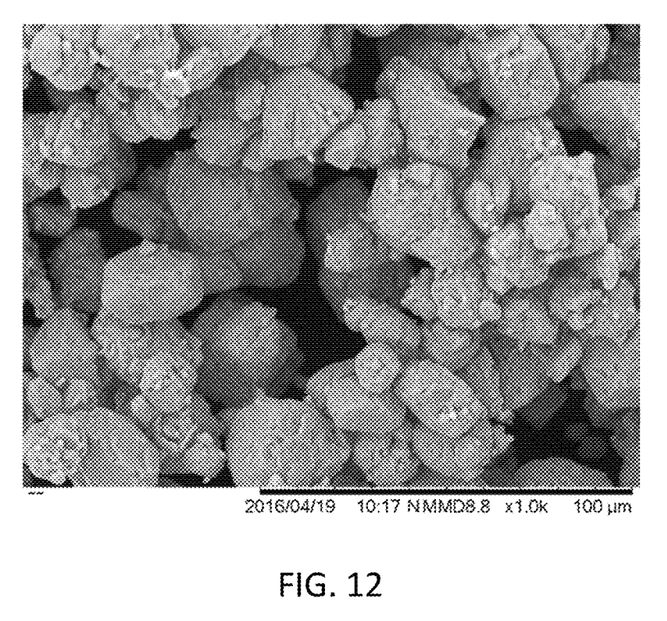

FIG. 12 is an SEM image of the JH-BM-05 (test) sample. As shown in Table 5, the normalized QE of all samples decreased after the exposure of the powders to HTHH for 47 hours, but the samples that were wet milled and annealed multiple times (e.g., JH-BM-05) decreased by significantly less. The largest decrease in QE of all of the powders prepared by wet milling the particles and annealing the particles multiple times according to the method 800 is 9.70% while the smallest decrease in QE of the particles prepared using the method 800 is 8.60%. The powders prepared without wet milling and without the multiple anneals, however, experienced a decrease in QE of 13.2% or 14.0%.

The particle sizes described herein were measured using a laser scattering particle size analyzer Horiba LA-960 with the refractive index set at 1.4 and ultrasound applied for 30 seconds at a power setting of level 7.

While only certain features of the inventive subject matter have been illustrated and described herein, many modifications and changes will occur to those of ordinary skill in the art. It is, therefore, to be understood that the appended claims are intended to cover all such modifications and changes as fall within the true spirit of the inventive subject matter described herein.

What is claimed is:

1. A method comprising:
   obtaining particles of a phosphor precursor of formula $A_x[MF_y]$:$Mn^{4+}$,
   wherein A includes one or more of lithium (Li), sodium (Na), potassium (K), rubidium (Rb), or cesium (Cs), wherein M includes one or more of silicon (Si), germanium (Ge), tin (Sn), titanium (Ti), zirconium (Zr), aluminum (Al), gallium (Ga), indium (In), scandium (Sc), hafnium (Hf), yttrium (Y), lanthanum (La), niobium (Nb), tantalum (Ta), bismuth (Bi), or gadolinium (Gd), wherein x has a value of an absolute value of a charge on an ion of $[MF_y]$, and wherein y has a value of at least five and no greater than seven;
   reducing sizes of the particles of the phosphor precursor by wet milling the particles, wherein reducing the sizes of the particles includes milling the particles in a solution that includes HF; and thereafter followed by a step of,
   annealing the particles that are wet milled by contacting the particles with a fluorine-containing oxidizing agent, thereby providing manganese doped complex fluoride phosphor.

2. The method of claim 1, wherein reducing the sizes of the particles includes milling the particles in a solution that further includes $A_x[MF_y]$.

3. The method of claim 1, wherein reducing the sizes of the particles includes milling the particles in a saturated solution of $A_x[MF_y]$ in aqueous HF.

4. The method of claim 1, wherein annealing the particles that are wet milled occurs at a temperature of at least 100 degrees Celsius.

5. The method of claim 1, wherein milling the particles reduces sizes of the phosphor precursor to a particle size distribution of median value being no greater than about twenty-two microns.

6. The method of claim 1, wherein milling the particles reduces sizes of the phosphor precursor to a particle size distribution of median value being no greater than about fifteen microns.

7. A method comprising:
   obtaining particles of a $K_2SiF_6$:$Mn^{4+}$ phosphor precursor;
   reducing sizes of the particles of the phosphor precursor by wet milling the particles, wherein reducing the sizes of the particles includes milling the particles in a solution that includes HF; and thereafter followed by a step of,
   annealing the particles that are wet milled by contacting the particles with a fluorine-containing oxidizing agent, thereby providing a manganese doped complex fluoride phosphor.

8. The method of claim 7, wherein reducing the sizes of the particles includes milling the particles in a saturated solution of $K_2SiF_6$ in aqueous HF.

9. The method of claim 7, wherein obtaining the particles includes synthesizing the particles by mixing solutions containing sources of potassium, silicon, and manganese, precipitating the particles from the solutions that are mixed, and filtering the particles and a remaining portion of the solutions.

10. The method of claim 7, wherein annealing the particles that are wet milled occurs at a temperature of at least 100 degrees Celsius.

11. The method of claim 7, wherein milling the particles reduces sizes of the phosphor precursor to a particle size distribution of median value being no greater than about twenty-two microns.

12. The method of claim 1, wherein the wet milling is conducted in the presence of inert milling media.

13. A method comprising:
   obtaining particles of a phosphor precursor of formula $A_x[MF_y]$:$Mn^{4+}$,
   wherein A includes one or more of lithium (Li), sodium (Na), potassium (K), rubidium (Rb), or cesium (Cs), wherein M includes one or more of silicon (Si), germanium (Ge), tin (Sn), titanium (Ti), zirconium (Zr), aluminum (Al), gallium (Ga), indium (In), scandium (Sc), hafnium (Hf), yttrium (Y), lanthanum (La), niobium (Nb), tantalum (Ta), bismuth (Bi), or gadolinium (Gd), wherein x has a value of an absolute value of a charge on an ion of $[MF_y]$, and wherein y has a value of at least five and no greater than seven;
   reducing sizes of the particles of the phosphor precursor by wet milling the particles in the presence of inert milling media, wherein reducing the sizes of the particles includes milling the particles in a solution that includes HF; and thereafter followed by a step of,
   annealing the particles that are wet milled by contacting the particles with a fluorine-containing oxidizing agent, thereby providing manganese doped complex fluoride phosphor.

14. The method of claim 13, wherein the inert milling media comprise milling balls.

15. The method of claim 13, wherein the inert milling media comprise PTFE.

16. The method of claim 13, wherein the inert milling media are inert to HF solution.

17. The method of claim 13, wherein reducing the sizes of the particles includes milling the particles in a saturated solution of $A_x[MF_y]$ in aqueous HF.

* * * * *